United States Patent

Wu

[11] Patent Number: 6,091,098
[45] Date of Patent: Jul. 18, 2000

[54] DOUBLE-CROWN RUGGED POLYSILICON CAPACITOR

[75] Inventor: Shye-Lin Wu, Hsinchu, Taiwan

[73] Assignee: Acer Semiconductor Manufacturing Inc., Hsinchu, Taiwan

[21] Appl. No.: 09/310,890

[22] Filed: May 12, 1999

Related U.S. Application Data

[63] Continuation-in-part of application No. 09/298,928, Apr. 23, 1999.

[51] Int. Cl.[7] .......................... H01L 27/108; H01L 29/76; H01L 29/788
[52] U.S. Cl. .......................... 257/309; 257/534; 438/241
[58] Field of Search .................................. 257/307, 308, 257/309, 534; 438/239, 241

[56] References Cited

U.S. PATENT DOCUMENTS

| | | | |
|---|---|---|---|
| 5,278,437 | 1/1994 | Wakamiya et al. | 257/309 |
| 5,434,812 | 7/1995 | Tseng | 365/149 |
| 5,608,247 | 3/1997 | Brown | 257/306 |
| 5,962,886 | 10/1999 | Mori et al. | 257/309 |

FOREIGN PATENT DOCUMENTS

| 4137669 | 5/1992 | Germany | 257/306 |
|---|---|---|---|

*Primary Examiner*—Donald L. Monin, Jr.
*Attorney, Agent, or Firm*—Harness, Dickey & Pierce, P.L.C.

[57] ABSTRACT

The capacitor of the present invention mainly includes the storage node 52, the capacitor dielectric layer 54, and the conductive layer 56. The storage node 52 is formed on the semiconductor substrate 30, and the storage node 52 includes a base member 52a, two vertical members 52b, two horizontal members 52c, and two sidewall members 52d, in which the base member 52a provides a conductive communication to an underlying conductive region in the substrate 30, the two vertical members 52b respectively extends upward from two lateral ends of the base member 52a, the two horizontal members 52c respectively and outwardly extends from two top ends of the two vertical members 52b, and the two sidewall members 52d respectively and upwardly extending from two outward ends of said two horizontal members 52c. The dielectric layer 54 is covered on the storage node 52 and the conductive layer 56 is formed on the dielectric layer 54.

4 Claims, 7 Drawing Sheets

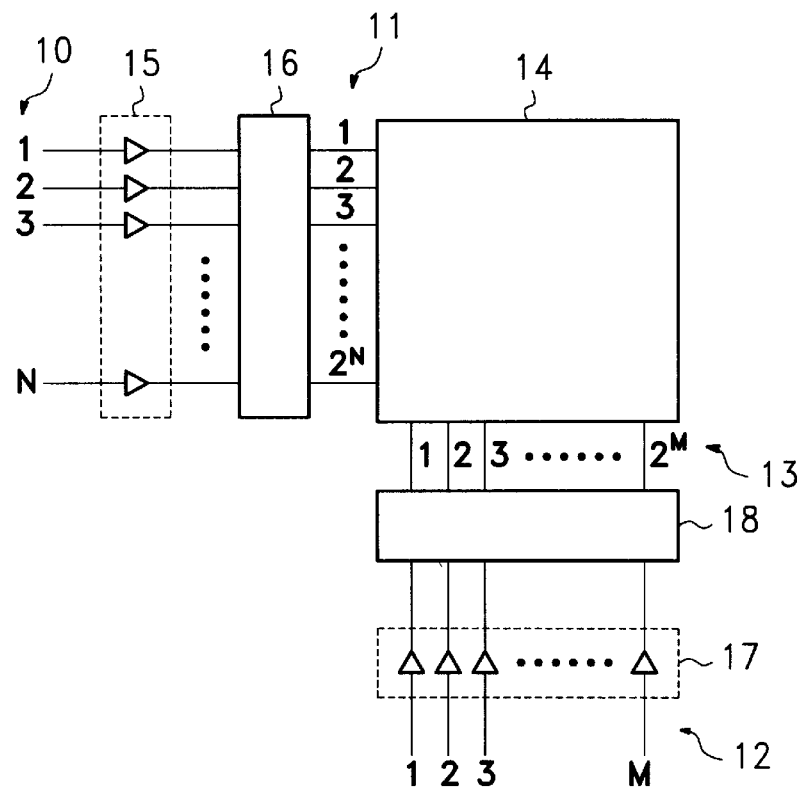
FIG.1
(Prior Art)
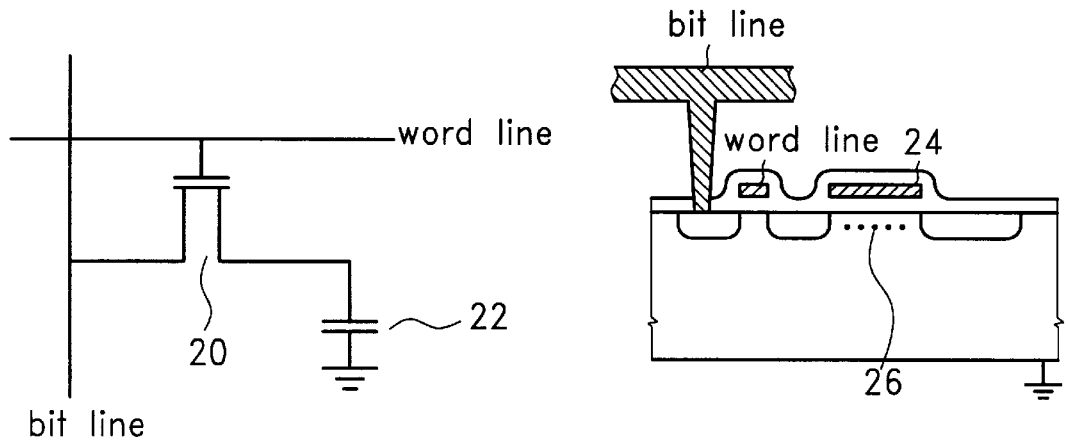
FIG.2A
(Prior Art)
FIG.2B
(Prior Art)

DOUBLE-CROWN RUGGED POLYSILICON CAPACITOR

This is a continuation-in-part of U.S. patent application Ser. No. 09/298,928, filed Apr. 23, 1999.

CROSS REFERENCE TO RELATED APPLICATIONS

This invention is a continuation-in-part application of an application filed under the title of "RUGGED POLYSILICON CUP-SHAPED CAPACITOR" filed at Apr. 23, 1999, which is assigned to same assignee with the same inventor as the present application.

BACKGROUND OF THE INVENTION

1. Field of the Invention

The present invention relates to semiconductor devices, and more particularly, to a double-crown rugged polysilicon capacitor and the method for forming the double-crown rugged polysilicon capacitor of a dynamic random access memory cell.

2. Description of the Prior Art

The increasing popularity of electronic equipment, such as computers for example, is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flows into and out of the cells via the bit lines 13.

Row address 10 and column address 12 are used to identify a location in the memory 14. A row address buffer 15 and a column address buffer 17, respectively, receive row address 10 signals and column address 12 signals. The buffers 15 and 17 then drive these signals to a row decoder 16 and column decoder 18, respectively. The row decoder 16 and the column decoder 18 then select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in "very large scale integration" (VLSI) ICs. For example, the memory 14 can be a dynamic random access memory (DRAM). DRAMs have become one of the most widely used types of semiconductor memory due to its low cost per bit, high device density and flexibility of use concerning reading and writing operations.

Early DRAMs used storage cells each consisting of three transistors and were manufactured using P type channel metal-oxide-semiconductor (PMOS) technology. Later, a DRAM storage cell structure consisting of one transistor and one capacitor was developed. A circuit schematic diagram corresponding to this structure is shown in FIG. 2A. The gate of the transistor 20 is controlled by a word line signal, and data, represented by the logic level of a capacitor voltage, is written into or read out of the capacitor 22 through a bit line. FIG. 2B shows the cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes more highly integrated, the area occupied by a capacitor of a DRAM storage cell typically shrinks. Thus, the capacitance of the capacitor is reduced owing to its smaller electrode surface area. However, a relatively large capacitance is required to achieve a high signal-to-noise ration in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing the storage capacitance while maintaining the small area occupied on the substrate surface. Consequently, this type of capacitor has come to be widely used in DRAM devices.

SUMMARY OF THE INVENTION

In accordance with the present invention, a double-crown rugged polysilicon capacitor and the method of forming the capacitor are provided, in order to form a double-crown rugged polysilicon capacitor of a dynamic random access memory cell that substantially increases the surface area of the capacitor.

The capacitor of the present invention mainly includes a storage node, a capacitor dielectric layer, and a conductive layer. The storage node is formed on a semiconductor substrate, and the storage node includes a base member, two vertical members, two horizontal members, and two side-wall members, in which the base member provides a conductive communication to an underlying conductive region in the substrate, the two vertical members respectively extends upward from two lateral ends of the base member, the two horizontal members respectively and outwardly extends from two top ends of the two vertical members, and the two sidewall members respectively and upwardly extending from two outward ends of said two horizontal members. The dielectric layer is covered on the storage node and the conductive layer is formed on the dielectric layer.

In the preferred embodiments, the base member has rugged surfaces on regions uncovered by an underlying insulation layer, the two vertical members, the two horizontal members, and the two sidewall members all have rugged surfaces.

In the preferred embodiment, a first dielectric layer is formed on a semiconductor substrate. A second dielectric layer is formed on the first dielectric layer, followed by the formation of a first conductive layer on the second dielectric layer. Portions of the first conductive layer and the second dielectric layer are then removed to define an opening therein. A second conductive layer is formed conformably on the substrate within the opening and on the first conductive layer. A sidewall structure is then formed within the opening on sidewalls of the second conductive layer.

Next, a removing step is performed to remove a portion of the second conductive layer which is uncovered by the sidewall structure. The sidewall structure and a portion of the first dielectric layer are removed, using the residual second conductive layer as a mask, to define a contact hole within the first dielectric layer. A third conductive layer is formed conformably on the substrate and filled up the contact hole. A series of steps are performed for forming and defining a patterning layer, which is defmed with a pattern of a storage node region, on the third conductive layer. Portions of the first conductive layer and the third conductive layer uncovered by the patterning layer are then removed. Conductive sidewalls are formed on sidewalls of the patterning layer, the first conductive layer and the third conductive layer. The patterning layer and the second dielectric layer are then removed to leave a storage node composed of the first conductive layer, the second conductive layer, the third conductive layer, and the conductive sidewalls. Finally, a third dielectric layer is formed on the substrate, and a fourth conductive layer is formed on the third dielectric layer to complete the formation of the capacitor.

In the preferred embodiments, the step of removing the patterning layer and the second dielectric layer is performed with a wet etch to roughen the surface of the storage node. As an example, the storage node is roughened with hot phosphoric acid solution.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 shows a simplified diagram illustrative of the organization of a typical large semiconductor memory;

FIG. 2A shows a circuit schematic diagram of a typical one-transistor dynamic random access memory (DRAM) cell;

FIG. 2B shows a cross-sectional view illustrative of traditional one-transistor DRAM storage cell;

DESCRIPTION OF THE PREFERRED EMBODIMENT

Figure 3:
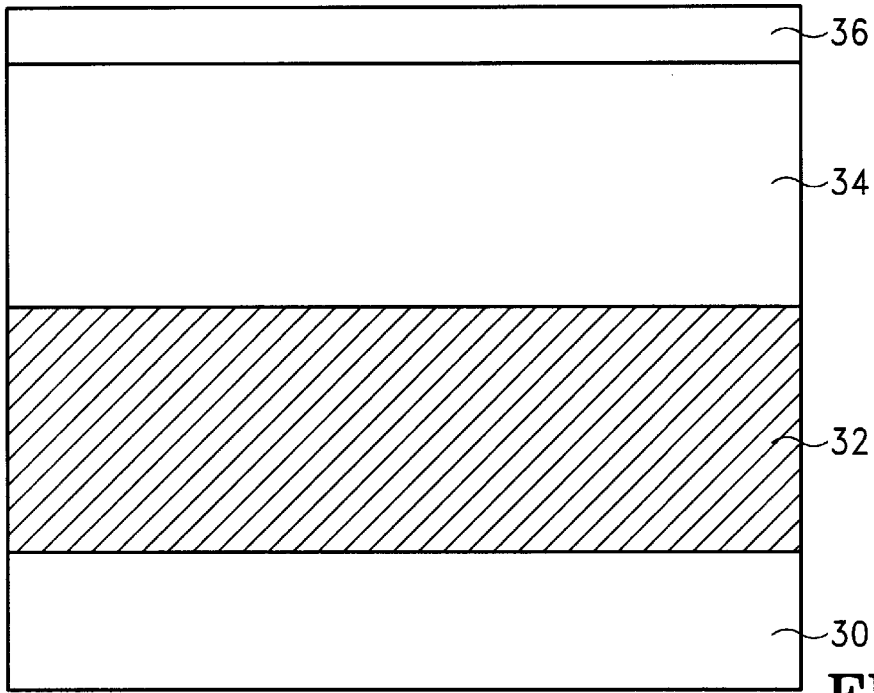
FIG. 3 shows a cross-sectional view illustrative of forming a first dielectric layer, a second dielectric layer, and a first conductive layer on a semiconductor substrate in accordance with the present invention.

Referring to FIG. 3, a semiconductor substrate 30 is provided for forming capacitors thereon. Generally, the substrate 30 has been formed with metal-oxide-semiconductor field effect transistors (MOSFETs) having gates and drain and source regions thereon. At first, a first dielectric layer 32, such as an undoped oxide layer, a doped silicon oxide layer or a boro-phosphosilicate glass (BPSG) layer, is formed on the substrate 30, in order to serve as the main insulation layer between conductive layers or conductive regions. The first dielectric layer 32 is typically deposited with a conventional low pressure chemical vapor deposition (LPCVD) or plasma enhanced chemical vapor deposition (PECVD) process. The thickness of this silicon oxide layer 32 can be ranged from about 3000 to 6000 angstroms.

After the silicon oxide layer 32 is deposited, a planarization process using any suitable conventional method such as an etch back process or a chemical mechanical polishing (CMP) process, is optionally performed to the substrate for providing better topography.

A second dielectric layer 34 is then formed on the first dielectric layer 32. In this embodiment, a silicon nitride layer is deposited using a conventional low pressure chemical vapor deposition (LPCVD) or plasma enhanced chemical vapor deposition (PECVD), to be utilized as the second dielectric layer 34. The thickness of the silicon nitride layer 126 is about 5000 to 10000 angstroms, in order to provide a recessed space for forming storage node therein and defining the main shape of the storage node.

A first conductive layer 36 is formed on the second dielectric layer 34, as shown in FIG. 3. In the preferred embodiments, the first conductive layer 36 is a doped polysilicon layer, which is formed, as an example, using a standard chemical vapor deposition process with in-situ doped n-type dopants, in order to serve as a part of the bottom electrode of the capacitor. In the preferred embodiments, the thickness of the first conductive layer 36 is between about 2000 to 10000 angstroms.

Figure 4:
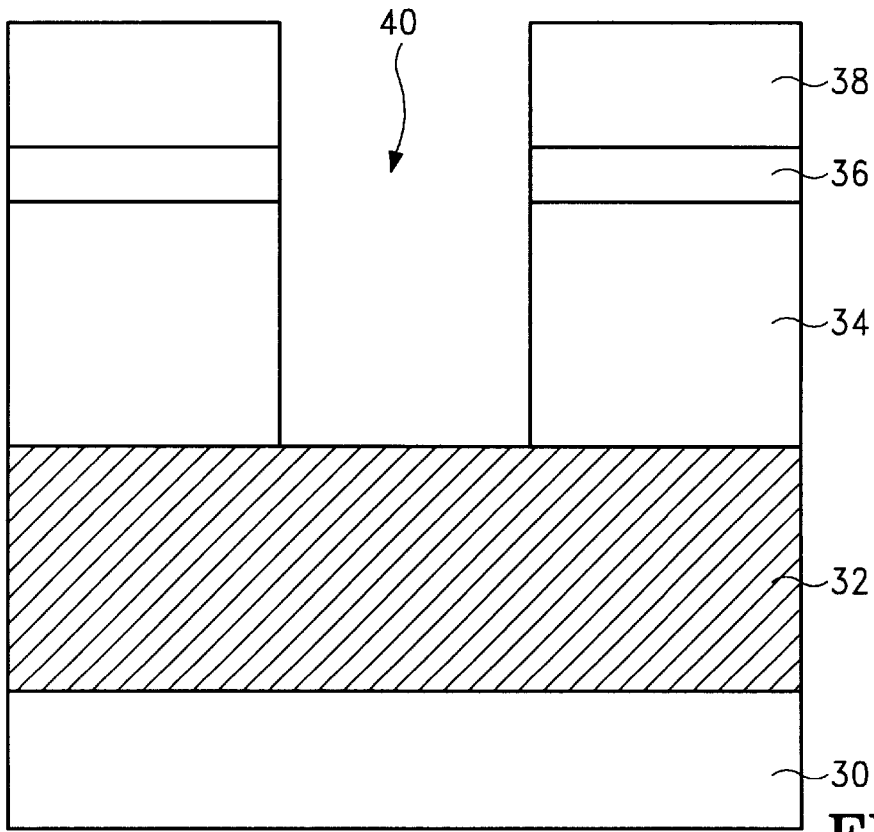
FIG. 4 shows a cross-sectional view illustrative of removing portions of the first conductive layer and the second dielectric layer to define an opening therein, in accordance with the present invention.

Turning to FIG. 4, after the first dielectric layer 32, the second dielectric layer 34 and the first conductive layer 36 is sequentially formed, portions of the first conductive layer 36 and the second dielectric layer 34 are removed to define an opening 40 therein. Conventionally, a series of steps are carried out to define the opening 40, such as lithography process to define the etch mask of a photoresist layer 38, one or more following etch steps to etch the first conductive layer 36 and the second dielectric layer 34, and a photoresist stripping process to remove the residual photoresist layer 38.

Figure 5:
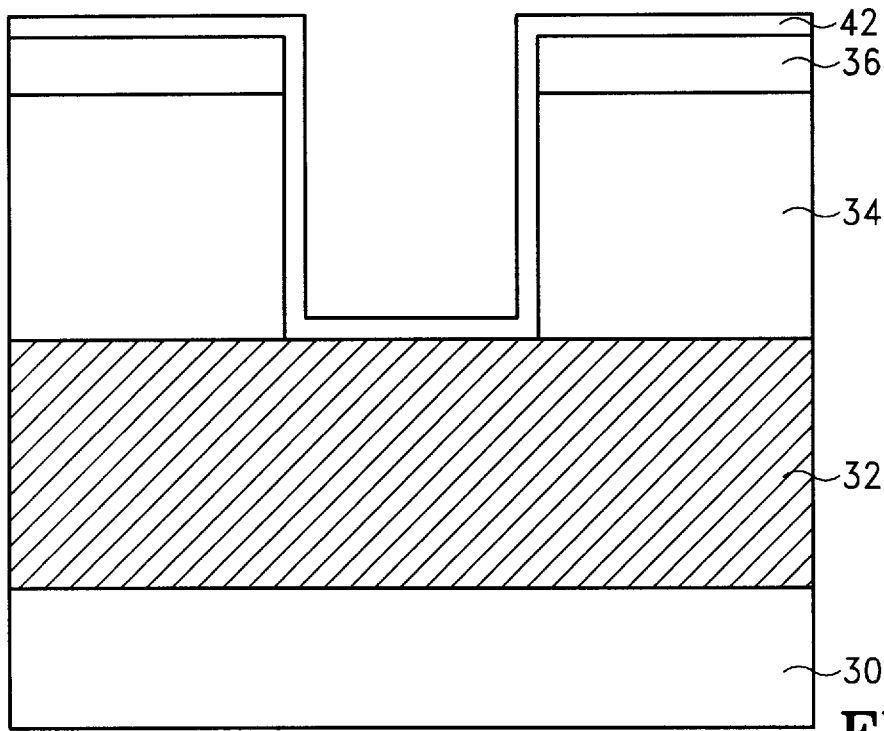
FIG. 5 shows a cross-sectional view illustrative of forming a second conductive layer conformably on the substrate within the opening and on the first conductive layer, in accordance with the present invention.

Turning to FIG. 5, a second conductive layer 42 is formed conformably on the substrate 30 within the opening 40 and on the first conductive layer 36. In the preferred embodiments, the second conductive layer 42 is a doped polysilicon layer, which is formed, as an example, using a standard chemical vapor deposition process with in-situ doped n-type dopants, in order to serve as a part of the bottom electrode of the capacitor. In the preferred embodiments, the thickness of the second conductive layer 42 is between about 200 to 2000 angstroms.

Figure 6:
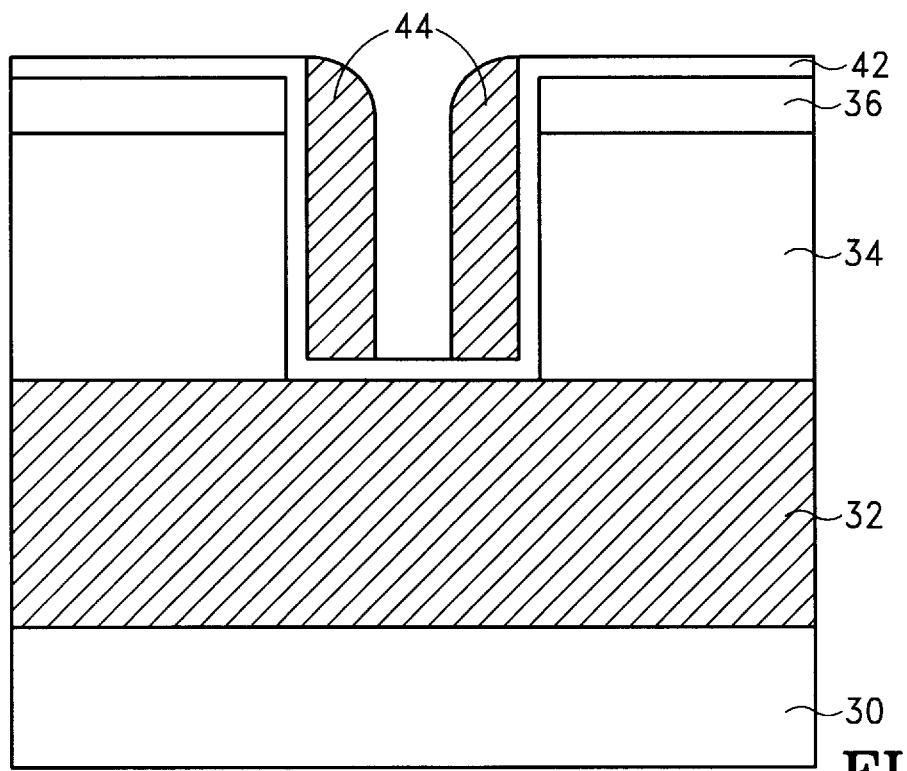
FIG. 6 shows a cross-sectional view illustrative of forming a sidewall structure within the opening on sidewalls of the second conductive layer in accordance with the present invention.

Next, a sidewall structure 44 is formed within the opening 40 on the sidewalls of the second conductive layer 42, as shown in FIG. 6. The sidewall structure 44 is employed to define the region of forming self-aligned contact holes in a later etch step. Having the sidewall structure 44, the contact hole region can be defined without utilizing a series of lithography processes, and the size of the contact holes can be defined in smaller scale without being limited to the capability of conventional lithography techniques. Silicon oxide sidewall spacers are preferably employed as the sidewall structure 44, and is typically formed by sequentially depositing and etching-back a silicon oxide layer to leave sidewall spacers on the sidewalls of the second conductive layer 42.

Figure 7:
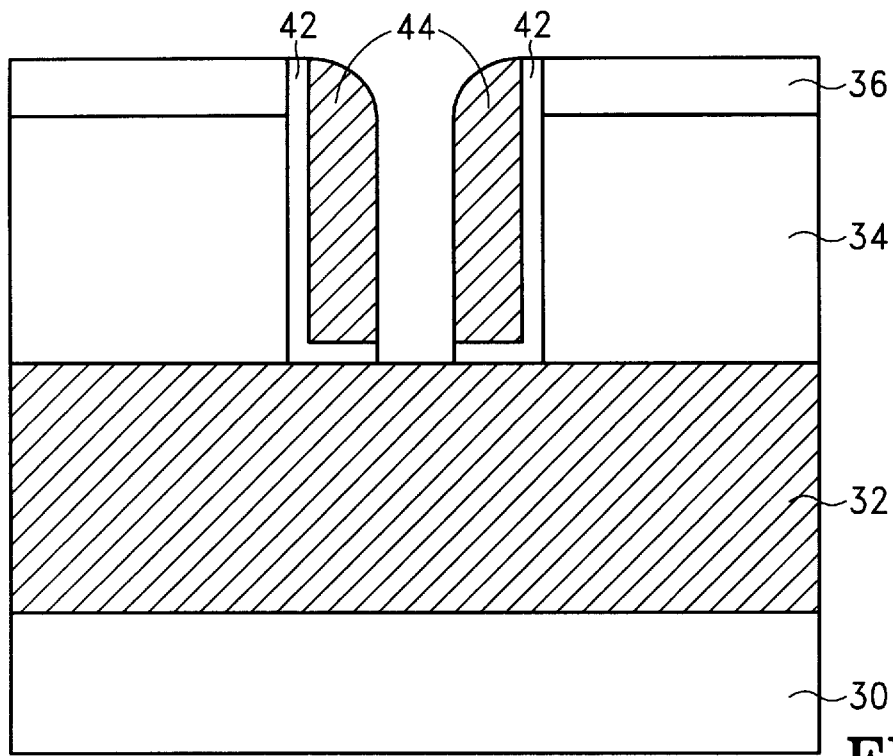
FIG. 7 shows a cross-sectional view illustrative of removing a portion of the second conductive layer which is uncovered by the sidewall structure in accordance with the present invention.

A portion of the second conductive layer 42, which is uncovered by the sidewall structure 44, is then removed as shown in FIG. 7. An etch step is preferably carried out using the sidewall structure 44 as a hard mask. Having the pattern defining sidewall structure 44, the process flow of the fabrication steps is further simplified and the process window is raised with the self-aligned etch process.

Figure 8:
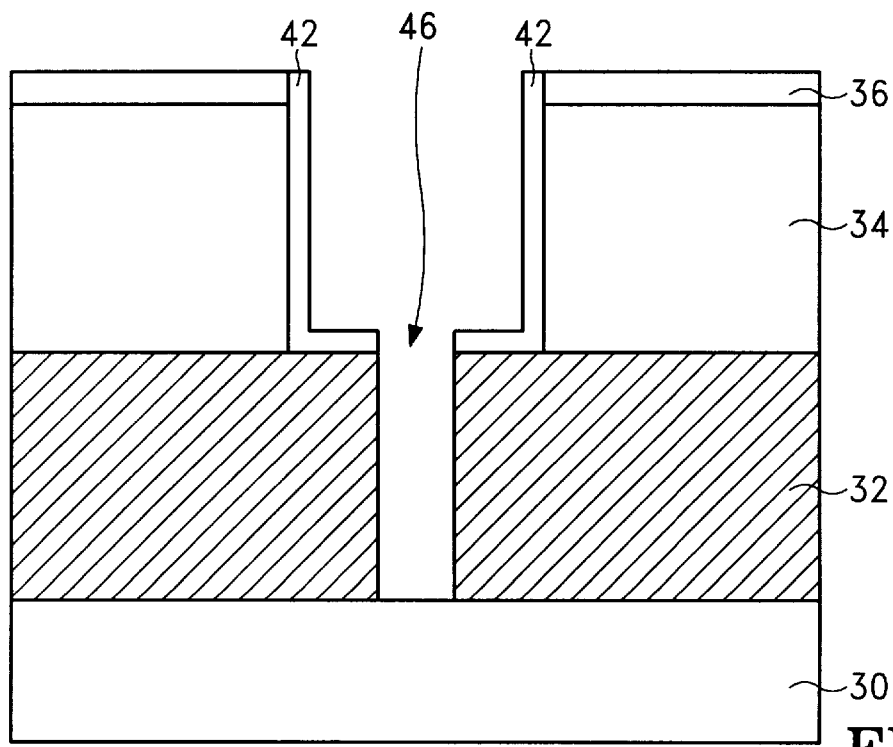
FIG. 8 shows a cross-sectional view illustrative of removing the sidewall structure and a portion of the first dielectric layer, using the residual second conductive layer as a mask, to define a contact hole within the first dielectric layer, in accordance with the present invention.

Turning to FIG. 8, the sidewall structure 44 and a portion of the first dielectric layer 32 are removed using the residual second conductive layer 42 as a mask, to define a contact hole 46 within the first dielectric layer 32. In the preferred embodiments, the contact hole 46 is extended down to a source region of a controlling transistor in the substrate 30.

Figure 9:
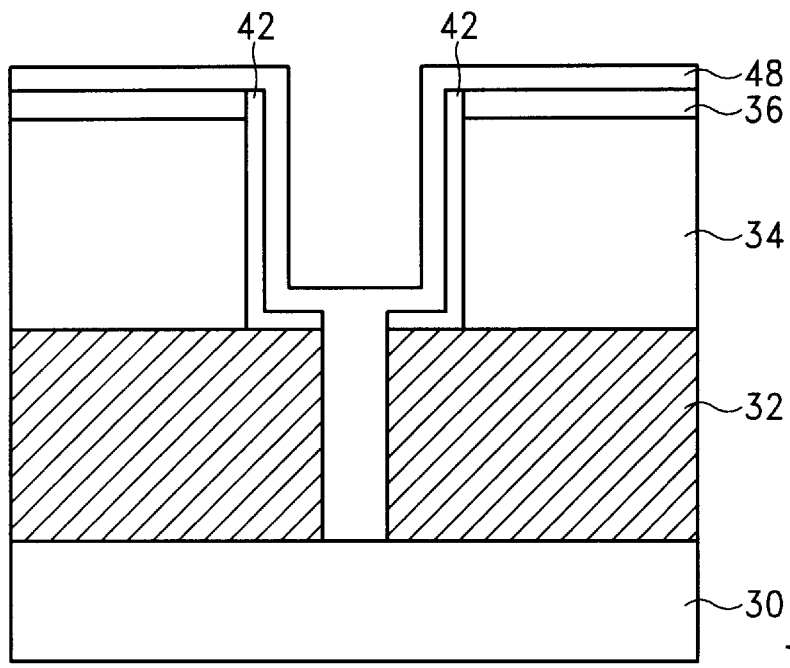
FIG. 9 shows a cross-sectional view illustrative of forming a third conductive layer conformably on the substrate and filled up the contact hole in accordance with the present invention.

Referring to FIG. 9, a third conductive layer 48 is then formed conformably on the substrate 30 and within the contact hole 46. In the case, the third conductive layer 48 is a doped polysilicon layer, which is formed, as an example, using a standard chemical vapor deposition process with in-situ doped n-type dopants, in order to serve as a part of the bottom electrode of the capacitor. In the preferred embodiments, the thickness of the third conductive layer 48 is between about 300 to 3000 angstroms.

Figure 10:
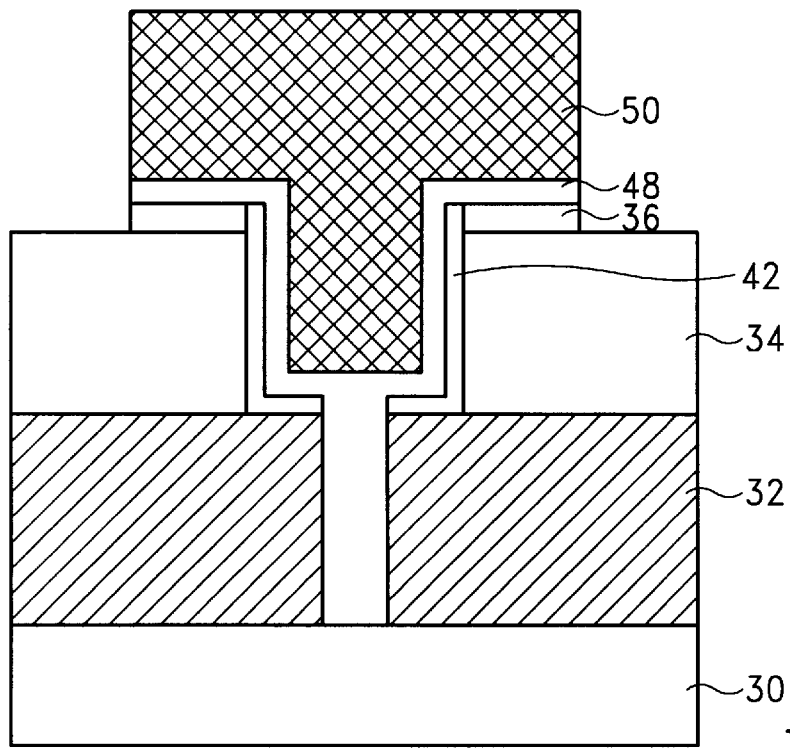
FIG. 10 shows a cross-sectional view illustrative of forming and defining a patterning layer on the third conductive layer, and removing portions of the first conductive layer and the third conductive layer uncovered by the patterning layer, in accordance with the present invention.

Turning to FIG. 10, a series of steps are then performed for forming and defining a patterning layer 50, which is defined with a pattern of a storage node region, on the third conductive layer 48. In the preferred embodiments, the patterning layer 50 is a silicon nitride layer and is deposited with a thickness between about 2000 to 12000 angstroms to assist the formation of vertical extended members of a conductive material which is formed in a later step. The silicon nitride layer 50 is typically deposited using a low pressure chemical vapor deposition (LPCVD) or plasma enhanced chemical vapor deposition (PECVD). The silicon nitride layer 50 is then patterned by sequentially applying lithography and etch processes to define the storage node region thereon. Portions of the first conductive layer 36 and the third conductive layer 48, which are covered by the patterning layer 50, are removed to leave a basic part of the storage node.

Figure 11:
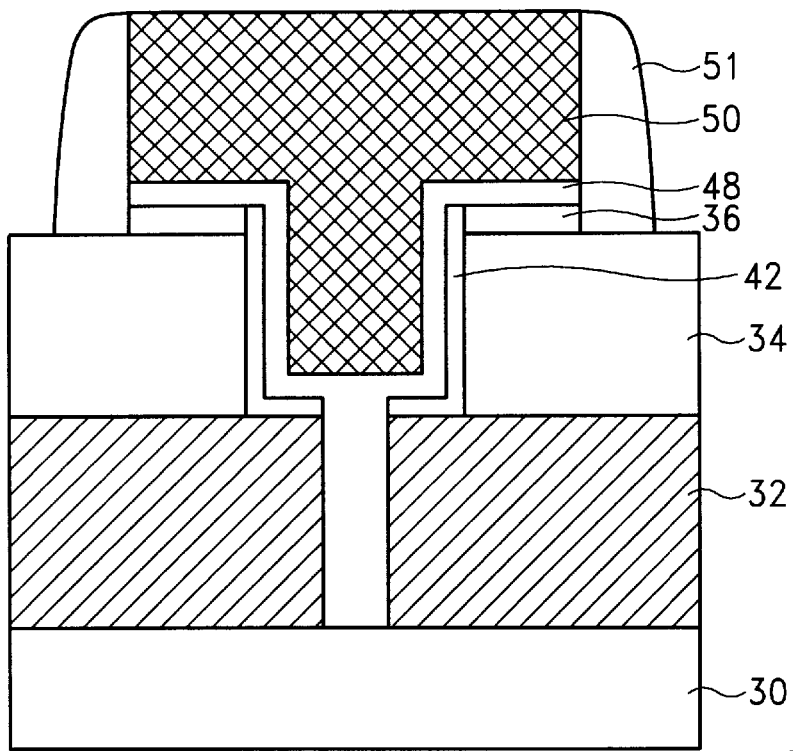
FIG. 11 shows a cross-sectional view illustrative of forming conductive sidewalls on sidewalls of the patterning layer, the first conductive layer and the third conductive layer.

Turning to FIG. 11, conductive sidewalls 51 are formed on sidewalls of the patterning layer 50, the first conductive layer 36 and the third conductive layer 48. In the preferred embodiments, the conductive sidewalls 51 are doped polysilicon sidewall spacers, which are preferably formed by depositing and etching back a doped polysilicon layer. The doped polysilicon layer is formed, as an example, using a standard chemical vapor deposition process with in-situ doped n-type dopants, in order to serve as a part of the bottom electrode of the capacitor. In the preferred embodiments, the thickness of the deposited doped polysilicon layer is between about 300 to 3000 angstroms.

Figure 12:
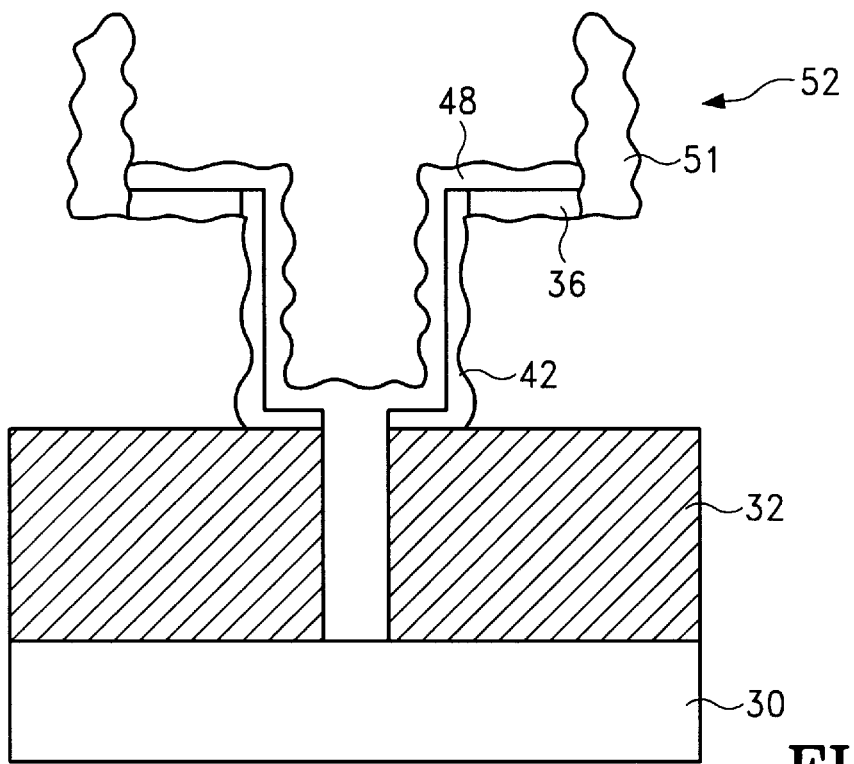
FIG. 12 shows a cross-sectional view illustrative of removing the patterning layer and the second dielectric layer to leave a storage node composed of the first conductive layer, the second conductive layer, the third conductive layer, and the conductive sidewalls, in accordance with the present invention.

Referring to FIG. 12, the patterning layer 50 and the second dielectric layer 34 are then removed to leave a storage node 52 composed of the first conductive layer 36, the second conductive layer 38, the third conductive layer 48, and the conductive sidewalls 52. As an example of employing silicon nitride as the patterning layer 50 and the second dielectric layer 34 in the case, a wet etch using hot phosphoric solution is carried out to remove silicon nitride, and also to remove part of the surface portion of polysilicon conductive layers 36, 42, 48 and 51 to roughen the surface of the storage node 52 for having a rugged surface as shown in the figure. In the most preferred embodiment, the composition of the phosphoric acid solution ($H_3PO_4$) is preferably about 86±1% $H_3PO_4$ and 14±1% $H_2O$. The temperature used in the embodiment is preferably about 150–170° C., and can be ranged between about 140° C. to 180° C. in general.

Figure 13:
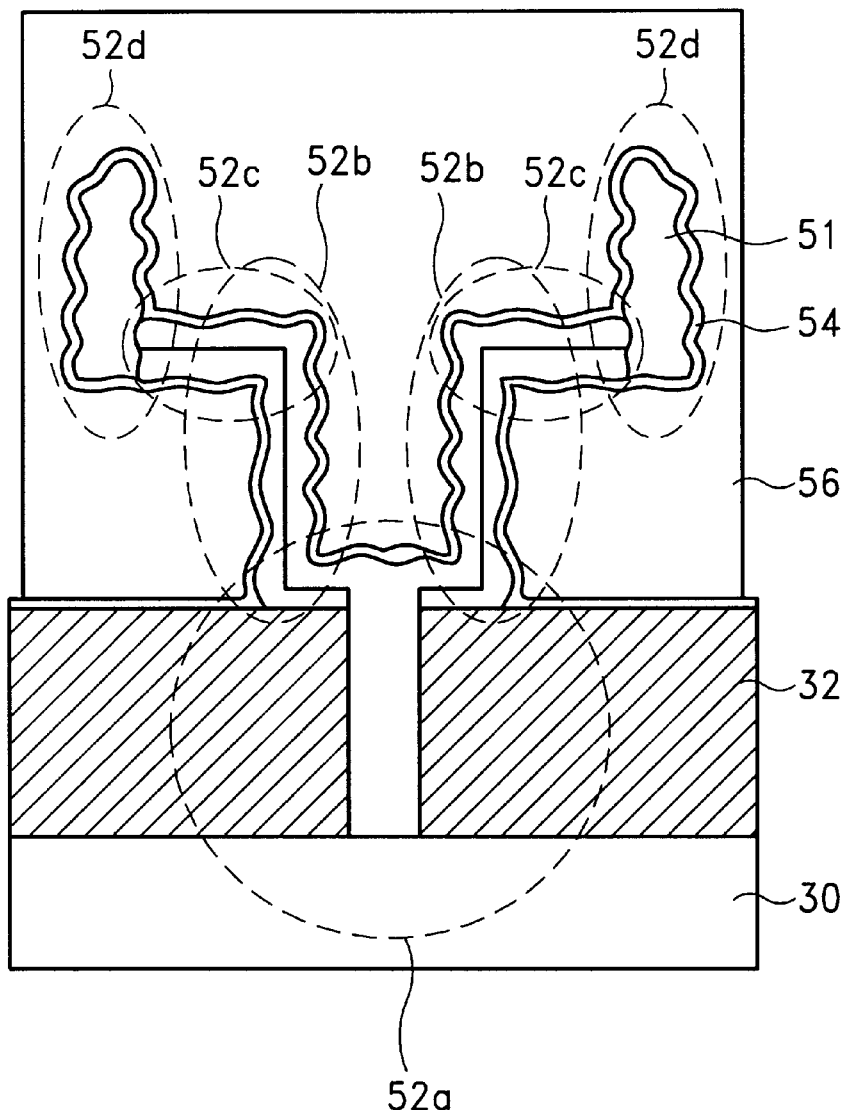
FIG. 13 shows a cross-sectional view illustrative of forming a third dielectric layer on the storage node and a fourth conductive layer to finish the capacitor structure in accordance with the present invention.

Referring to FIG. 13, a third dielectric film 54 and a fourth conductive layer 56 for the top electrode of the DRAM cell capacitor are then formed on the storage node 52 and the substrate 30 in the conventional manner. In this embodiment, a thin dielectric layer 54, such as stacked oxide-nitride-oxide (ONO) film, is formed on the exposed surface of the bottom electrode 52 and the surface of the first dielectric layer 32. As is known in the art of DRAM fabrication, the ONO film is reliable over silicon surfaces, and is typically used as a capacitor insulator. Other material, such as NO (silicon nitride-silicon oxide), $Ta_2O_5$, $TiO_2$, PZT, or BST can be used as the thin dielectric layer 134. A fourth conductive layer 56 is then deposited over the stack silicon oxide/silicon nitride/ silicon oxide layer 54 to serve as an upper plate of the DRAM cell capacitor, thereby forming a dynamic random access memory cell with a double-crown rugged polysilicon capacitor. Typically, the second conductive layer 56 is a doped polysilicon layer formed in the same manner as the polysilicon layer 48. Other material, such as metal or silicide, can be used as the conductive layer 56.

As shown in FIG. 13, the capacitor of the present invention mainly includes includes the storage node 52, the capacitor dielectric layer 54, and the conductive layer 56. The storage node 52 is formed on the semiconductor substrate 30, and the storage node 52 includes a base member 52a, two vertical members 52b, two horizontal members 52c, and two sidewall members 52d, in which the base member 52a provides a conductive communication to an underlying conductive region in the substrate 30, the two vertical members 52b respectively extends upward from two lateral ends of the base member 52a, the two horizontal members 52c respectively and outwardly extends from two top ends of the two vertical members 52b, and the two sidewall members 52d respectively and upwardly extending from two outward ends of said two horizontal members 52c. The dielectric layer 54 is covered on the storage node 52 and the conductive layer 56 is formed on the dielectric layer 54.

In light of the aforementioned method for forming the capacitor, the base member 52a has rugged surfaces on regions uncovered by an underlying insulation layer 32, the two vertical members 52b, the two horizontal members 52c, and the two sidewall members 52d all have rugged surfaces.

Although specific embodiments have been illustrated and described, it will be obvious to those skilled in the art that various modifications may be made without departing from the spirit which is intended to be limited solely by the appended claims.

What is claimed is:

1. A capacitor comprising:

a storage node connecting to a semiconductor substrate through a dielectric layer formed upon said semiconductor substrate, said dielectric layer having a first rugged surface uncovered from the dielectric layer, said storage node comprising:

a base member providing a conductive communication to an underlying conductive region of said semiconductor substrate through said dielectric layer, said base member including two lateral ends;

two vertical members respectively extending upwardly from said two lateral ends of said base member, each of said two vertical members including sides and top ends, said vertical members having a second rugged surface thoroughly distributing over each of said sides of said vertical members;

two horizontal members respectively and outwardly extending from said two top ends of said two vertical members, each of said two horizontal members including sides and a bottom face, said horizontal members having a third rugged surface thoroughly distributing over each of said sides, including said bottom face, of each of said horizontal members; and two sidewall members respectively and upwardly extending from two outward ends of said two horizontal members, each of said sidewall members having sides, said sidewall members having a fourth rugged surface thoroughly distributing over each of said sides of said sidewall members;

a dielectric layer on said storage node; and a conductive layer on said dielectric layer.

2. The capacitor according to claim 1, wherein said storage comprises doped polysilicon.

3. The capacitor according to claim 1, wherein said dielectric layer comprises a material selected from the group consisting of stacked oxide-nitride-oxide (ONO) film, NO, $Ta_2O_5$, $TiO_2$, PZT, and BST.

4. The capacitor according to claim 1, wherein said conductive layer comprises doped polysilicon.

* * * * *

UNITED STATES PATENT AND TRADEMARK OFFICE
CERTIFICATE OF CORRECTION

PATENT NO. : 6,091,098
DATED : July 18, 2000
INVENTOR(S) : Shye-Lin Wu

It is certified that error appears in the above-identified patent and that said Letters Patent is hereby corrected as shown below:

Column 1, line 20, after "and" insert --to--.

Column 2, line 11, change "ration" to --ratio--.

Column 2, line 45, change "extends" to --extend--.

Column 2, line 47, change "said" to --the--.

Column 3, line 4, change "filled" to --fills--.

Signed and Sealed this

Tenth Day of October, 2000

*Attest:*

Q. TODD DICKINSON

*Attesting Officer*   *Director of Patents and Trademarks*